United States Patent [19]
Arakawa et al.

[11] Patent Number: 5,313,150
[45] Date of Patent: May 17, 1994

[54] DRIVE CONTROL APPARATUS FOR AN AIR CONDITIONER HAVING A MODULAR INVERTER AND A CONTROL CIRCUIT MOUNTED ON A COMMON SUBSTRATE

[75] Inventors: Noriaki Arakawa, Tochigi; Makoto Isii, Utsunomiya, both of Japan

[73] Assignee: Hitachi, Ltd., Tokyo, Japan

[21] Appl. No.: 907,556

[22] Filed: Jul. 2, 1992

[30] Foreign Application Priority Data

Jul. 5, 1991 [JP] Japan .................. 3-191129

[51] Int. Cl.⁵ .......................................... H02M 5/458
[52] U.S. Cl. ..................... 318/768; 363/56; 363/147; 363/36
[58] Field of Search ...... 363/36, 37, 147, 56; 318/768, 811; H02M 5/458

[56] References Cited

U.S. PATENT DOCUMENTS

| | | | |
|---|---|---|---|
| 4,575,668 | 3/1986 | Baker | 318/811 |
| 4,849,950 | 7/1989 | Sugiura et al. | 363/37 |
| 4,918,590 | 4/1990 | Ohtuka | 363/37 |
| 5,077,595 | 12/1991 | Fukunaga | 357/40 |
| 5,253,156 | 10/1993 | Sakurai et al. | 363/56 |

FOREIGN PATENT DOCUMENTS

| | | | |
|---|---|---|---|
| 0297545 | 1/1989 | European Pat. Off. | H02M 3/07 |
| 4102574 | 8/1991 | Fed. Rep. of Germany . | |
| 62-107681 | 5/1987 | Japan . | |
| 63-80778 | 4/1988 | Japan . | |
| 3-7075 | 1/1991 | Japan . | |
| 3-56074 | 3/1991 | Japan | H02M 7/48 |
| 3-226291 | 10/1991 | Japan . | |
| 3-270677 | 12/1991 | Japan . | |
| 2214745 | 9/1989 | United Kingdom | H03F 3/45 |

OTHER PUBLICATIONS

3rd ISPSD '91–Apr. 22, 1991, Baltimore USA, pp. 45–48, T.ASO and AL. 'An Application of MSSD to Dielectrically Isolated Intelligent Power IC'.

*Primary Examiner*—William H. Beha, Jr.
*Attorney, Agent, or Firm*—Antonelli, Terry, Stout & Kraus

[57] ABSTRACT

A drive control apparatus for controlling a motor to drive the compressor of an air conditioner, according to the present invention, includes a rectifying circuit for converting an AC voltage into a DC voltage, an inverter having a combination of a plurality of power controlling semiconductor devices and which controls the DC voltage from the rectifying circuit in accordance with a drive signal supplied to the combination of the semiconductor devices so as to generate an AC drive current to the drive, and a drive circuit for generating the drive signal to the inverter. The drive circuit formed as a monolithic integrated circuit having a dielectric separation structure, with the monolithic integrated circuit and the inverter being mounted on a common module substrate.

7 Claims, 9 Drawing Sheets

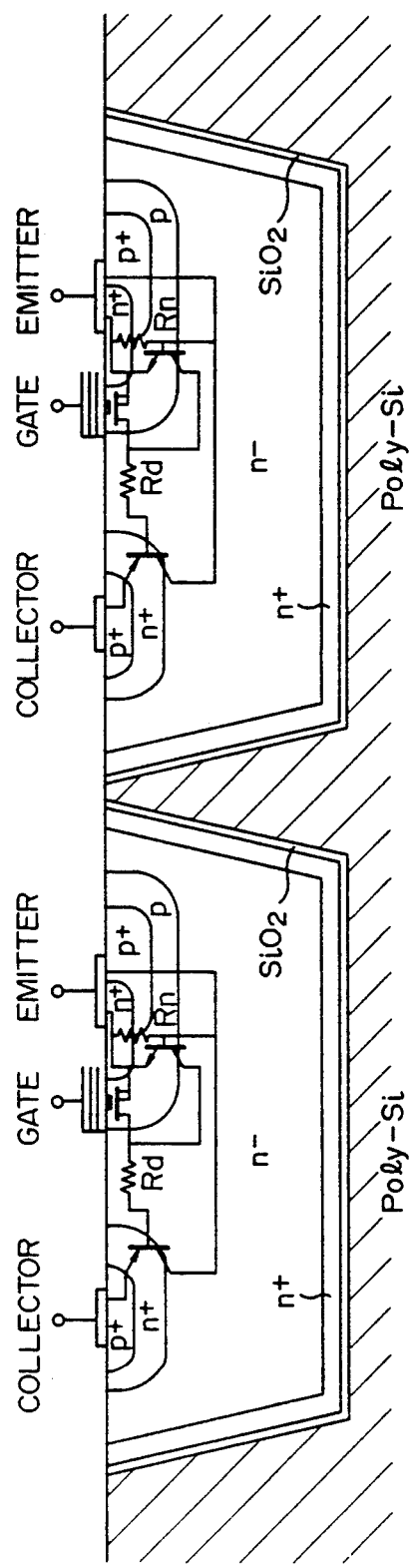
F I G. 5A
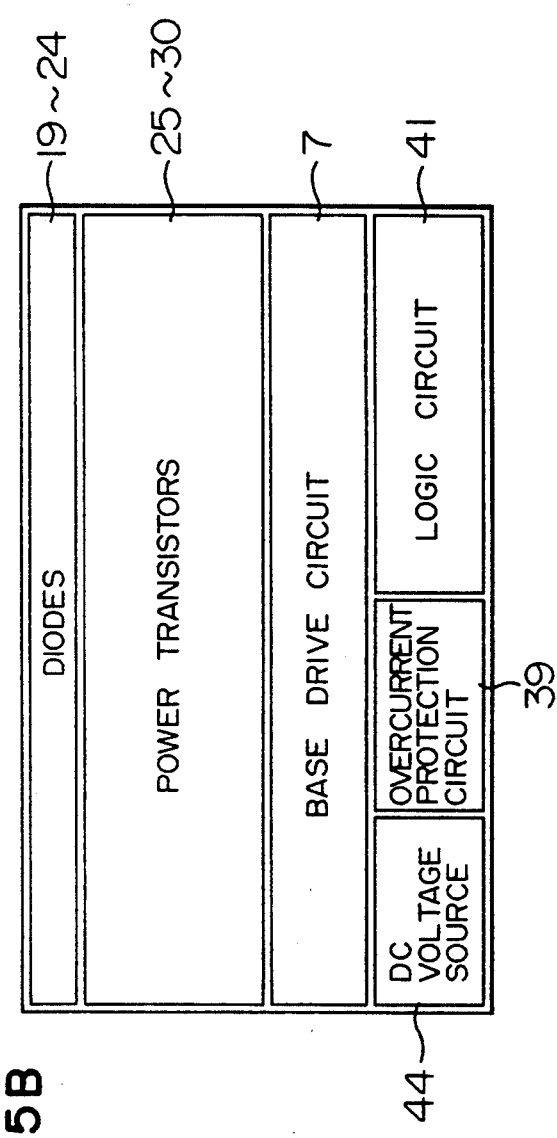
F I G. 5B

DRIVE CONTROL APPARATUS FOR AN AIR CONDITIONER HAVING A MODULAR INVERTER AND A CONTROL CIRCUIT MOUNTED ON A COMMON SUBSTRATE

BACKGROUND OF THE INVENTION

This invention relates to a drive control apparatus for controlling a motor to drive the compressor of an air conditioner, and particularly to a novel arrangement of the circuits constituting the drive control apparatus.

The motor in the conventional air conditioner used in homes and offices has a constant revolution speed depending on the frequency of the commercial power supply in the area in which the conditioner is used, and hence the cooling/heating ability is also constant. Therefore, since the cooling/heating ability cannot be directly adjusted, the compressor is controlled to be on and off, or to intermittently operate, thereby adjusting the room temperature. Thus, the efficiency of the air conditioner is low. In addition, at the start of the cooling/heating operation, cooling/heating ability is insufficient.

Recently, an inverter circuit including semiconductor switching devices has been used for the control of a motor in order that changes to revolution speed (frequency) of the motor and the voltage can be controlled, and this inverter has also been employed in the air conditioner. Use of the inverter circuit for the control of the motor in the air conditioner makes it possible to control the revolution speed of the compressor and hence to change the cooling/heating ability thereof. This leads to the reduction of energy consumption and to a more comfortable cooling/heating effect.

FIG. 1 shows an arrangement of the inverter-incorporated drive control circuit for the air conditioner. In FIG. 1, there are shown a compressor-driving power converter 1, a compressor motor 2, a compressor 3, a signal controller 4, an inverter 5, a rectifying circuit 6, a base drive circuit 7, a microcomputer 8, a sensor 9, a commercial power supply 10, a power-factor improving reactor 11, a power-factor improving capacitor 12, a current detecting resistor 13, a smoothing capacitor 14, diodes 15 to 18, circulation diodes 19 to 24, power transistors 25 to 30, a temperature detector 31 for the compressor 3, a microcomputer control circuit 32, and a DC voltage source 40.

As shown in FIG. 1, the inverter-incorporated drive control apparatus for the air conditioner has a larger number of circuit components and more kinds of components than the conventional drive control apparatus having no inverter, and the circuit construction is more complicated than the conventional one. The air conditioner for home use and office use is desired to be as small as possible, but the inverter-incorporated air conditioner is inevitably large.

The drive control apparatus of FIG. 1 will be further described in detail.

Referring to FIG. 1, the compressor driving power converter 1 includes a filter formed of the reactor 11 and the capacitor 12, the rectifying circuit 6 formed of the diodes 15 to 18, the smoothing capacitor 14, the resistor 13, the inverter 5 and the base drive circuit 7. The AC voltage from the commercial AC power supply 10 is supplied through the LC filter of the reactor 11 and the capacitor 12 to the rectifying circuit 6 and the smoothing capacitor 14, thereby being rectified and smoothed into a DC voltage. This DC voltage is applied to the inverter 5.

On the other hand, the microcomputer 8 is controlled by the microcomputer control circuit 32 so as to produce a rotation control signal (PWM) signal in response to the temperature of compressor detected by the temperature detector 31 and the ambient temperature detected by the sensor 9. The base drive circuit 7 is controlled by this control signal so as to drive the power transistors 25 to 30 of the inverter 5. The inverter 5 is thus controlled by the control signal so as to convert the DC voltage into a three-phase drive current and supply it to the motor 2. The microcomputer 8 detects the change of the load on the compressor 3 from the current flowing in the resistor 13, and controls the revolution speed of the motor 2 in accordance with this load change.

In order for the inverter 5 to generate a large drive current, the base drive circuit 7 drives the inverter 5 at a high voltage under the control of the microcomputer 8. The base drive circuit 7 is shown by one block in FIG. 1 for convenience of explanation. In practice, the base drive circuit is provided for each power transistor so that the drive signal is supplied to the base of that power transistor from that base drive circuit as illustrated. The power transistors 28, 29 and 30 of the lower arm of the inverter 5 are driven by a common base drive circuit which is supplied with a DC voltage from the DC power supply 40. The power transistors 25, 26 and 27 of the upper arm of the inverter 5 are, respectively, driven by three separate base drive circuits which are supplied with DC voltages from the DC power supply 40.

The base drive circuit 7 has a portion which treats a high voltage. Thus, the microcomputer 8 must be electrically separated from the high voltage treating portion. According to Japanese Registration of Utility Model Publication Gazette No. 63-5436, a photocoupler is used as this separate means. The base drive circuit 7 is also provided with an overcurrent protection circuit for protecting the power transistors 25 to 30 of the inverter 5.

FIG. 2 is a circuit diagram of the drive portion of an example of the base drive circuit 7 shown in FIG. 1. This example is disclosed in the above-given Gazette No. 63-5436, and used for the power transistor 25 of the inverter 5.

Referring to FIG. 2, an output pulse signal (the control signal) from the microcomputer 8(FIG. 1) is supplied through input terminals 33, 34 and through a photocoupler 35 to a pulse amplifying circuit. This pulse amplifying circuit is electrically separated from the microcomputer 8 by the photocoupler 35. The collector of the phototransistor within the photocoupler 35 is connected to the high-potential side (6 V side as illustrated) of an internal DC power supply (not shown). The emitter of the phototransistor is connected through a series circuit of resistors R4, R5 to the low-potential side (ground). The junction between the resistors R4, R5 is connected to the base of an NPN transistor Tr1. The collector of this NPN transistor Tr1 is connected to the high-potential side of the internal DC power supply through a series circuit of a resistor R6 and a forward-biased diode D1. The emitter of the NPN transistor Tr1 is connected to the low-potential side of the internal DC power supply.

The junction of the diode D1 and the collector of the transistor Tr1 is connected through a resistor R7 to the base of a first PNP transistor Tr2. The base of the transistor Tr2 is also connected through a resistor R8 to the high-potential side of the internal DC power supply. In addition, this transistor Tr2 has its emitter directly connected to the high-potential side of the internal DC power supply, and its collector connected through a resistor R9 to the base of the power transistor 25.

The junction between the diode D1 and the resistor 6 is connected through a diode D4 to the base of an NPN transistor Tr3. The collector of this transistor Tr3 is connected through a resistor R10 to the resistor R9 and to the base of the power transistor 25. The emitter of the transistor Tr3 is connected to the low-potential side of the internal DC power supply. The emitter and base of this transistor Tr3 are connected through a resistor R11.

Also, the emitter of the power transistor 25 is connected to the low-potential side of the internal DC power supply through a parallel circuit of two serially connected forward-biased diodes D2, D3 and a capacitor C.

When the output pulse signal from the microcomputer 8 is supplied through the input terminals 33, 34 to the above-mentioned drive portion, the photocoupler 35 is turned on, allowing the base current to flow to the base of the transistor Tr1 through the resistor R4, so that the transistor Tr1 is turned on. Thus, a current is flows through the resistor R6 so as to reduce the potential of the base of the transistor Tr2, so that the transistor Tr2 is turned on. Therefore, a base forward current I B1 flows to the base of the power transistor 25 through the transistor Tr2 and resistor R9, thus turning the power transistor 25 on. When the power transistor 25 becomes conductive, a current flows into the capacitor C through the emitter of the power transistor 25, charging it to the voltage corresponding to the voltage drop across the two serially connected diodes D2 and D3.

In order to speed up the charging to the capacitor C, a resistor R0 may be connected between the junction of the capacitor C and the emitter of the power transistor 25 and the high-potential side of the internal DC power supply as indicated by the broken line.

When the transistor Tr2 is in the on-state, the transistor Tr3 is turned off since its base is at the low potential. Therefore, when the output pulse signal from the microcomputer 8 is not supplied to the photocoupler 35, the photocoupler 35 is turned off, and thus the transistor Tr1 becomes nonconductive. When the transistor Tr1 is turned off, the transistor Tr2 is turned off since its base is at the high potential, so that the base current I B1 does not flow to the base of the power transistor 25. At the same time, the transistor Tr3 is turned on since its base is at the high potential. In this case, the emitter of the power transistor 25 is at a higher potential than the low-potential side of the internal DC power supply because of the charged voltage across the capacitor C. Thus, a reverse current $I_{B2}$ flows for a short time to the base of the transistor Tr3 through the resistor R10 from the base of the power transistor 25. This base reverse current $I_{B2}$ serves to rapidly discharge the accumulated charge on the capacitor C and the accumulated charge between the base and emitter of the power transistor 25, thus turning the power transistor 25 off.

Accordingly, the power transistor 25 has a high switching speed since it can be quickly and accurately turned on and off.

FIG. 3 is a perspective view of the construction of the drive control apparatus mentioned above.

Referring to FIG. 3, the power transistors 25 to 30, serving as chip components, are mounted on a module 36. In addition, on a circuit board 37 there are mounted the photocouplers 35 and pulse amplifying circuits of the base drive circuit 7, the overcurrent protecting circuit 39 and internal DC power supply incorporated within the base drive circuit 7, and the microcomputer 8. The drive control apparatus in the prior art is thus formed of the semiconductor devices which are mounted as discrete components on the circuit board as described above.

FIG. 4 is a block diagram of the circuit arrangement of the drive control apparatus of such construction as shown in FIG. 3. The internal DC power supply 40 generates and supplies DC voltages to the respective power transistors 25, 26 and 27, and a DC voltage common to the power transistors 28 to 30.

Furthermore, as released in the Japanese Denpa Shimbun dated Mar. 22, Heisei 2(1990), published by the Denpa Publications Inc., a three-phase inverter (hereinafter, referred to as the one-chip three-phase inverter) has been developed which uses a DC source voltage obtained by rectifying and smoothing the commercial AC voltage of 100 V, and controls the revolution speed of the motor by the dielectric-separation monolithic structure.

As patent applications concerning the one-chip inverter, there are Japanese Patent Application Laid-open Gazettes No. 3-226291 filed Jan. 31, 1990, No. 3-270677 filed Mar. 20, 1990, and No. 63-233431 filed Sep. 20, 1988, U.S. Pat. Nos. 4,890,009, 4,841,427, 5,008,586, and 5,057,721.

The dielectric-separation method will be briefly described below. In the conventional separation technique using PN junctions, a latch-up phenomenon occurs as the voltage is increased, and normally at 100 V or above, reliability cannot be assured. Thus, if the insulation between the devices can be satisfactorily performed by the dielectric separation technique, the breakdown voltage of several hundreds of volts can be assured and the commercial source voltage can also be used. The device structure of the one-chip three-phase inverter using the dielectric separation technique, as shown in FIG. 5A, employs polysilicon (Poly-Si) as the base and has the respective-phase areas partitioned to be resistant to high voltages by the dielectric separation means, or $SiO_2$ layers so that one-phase circuit can be formed within each of the areas.

FIG. 5B is a plan view of this one-chip three-phase inverter, showing the layout of the respective devices. This monolithic semiconductor integrated circuit chip inverter includes 6 power transistors 25 to 30 which make switching operation as main devices, 6 diodes 19 to 24 which are respectively connected between the collector and emitter of the power transistors 25 to 30 so as to turn off the power transistors 25 to 30, a logic circuit 41 for generating switching control signals by which the power transistors 25 to 30 are turned on and off, the drive circuit 7 for driving the power transistors 25 to 30 to be turned on and off in response to the switching control signals, the overcurrent protection circuit 39 which detects the currents flowing in the power transistors and prevents the integrated circuit IC from being broken by the overcurrents, and the internal DC power supply 40. This one-chip three-phase inverter IC has the dimensions of 4.3 mm in length and 5.8 mm in width.

A lateral-type IGBT (Insulated Gate Bipolar Transistor) has been developed and employed for the power transistors 25 to 30 of the one-chip three-phase inverter. Thus, the occupied area can be greatly reduced as compared with that in the conventional power MOSFET. In addition, a high-speed diode which can be produced by the same process as that of the lateral-type IGBT has been developed and used for the circulation diodes 19 to 24. Thus, the reverse recovery current can be greatly decreased so that the switching loss of the power transistors 25 to 30 due to the reverse recovery current can be reduced considerably.

In addition, since the internal DC power supply 40 is incorporated in the one-chip three-phase inverter, only the external power supply may be provided for driving the power transistors 25 to 30 as the power devices. Also, since the overcurrent protection circuit 39 is incorporated in the one-chip three-phase inverter, this IC can be prevented from being broken down by the overcurrent which occurs if a short circuit should form across the load, for example. Moreover, the inverter frequency is selected to be a higher frequency of 20 kHz than the audio frequencies so that the noise of the motor can be reduced.

In the above-mentioned conventional drive control apparatus, however, as shown in FIG. 3 the electrical parts other than the module unit of inverter 36 are mounted as discrete components and as semiconductor devices on the circuit board 37, and the DC power supply 40 must generate 4 different DC voltages, that is, DC voltages to the three respective power transistors of the upper arm of the inverter and a DC voltage common to the three power transistors of the lower arm, and is therefore of considerable size. Since this large internal DC power supply is also mounted on the circuit board, the circuit board 37 is required to be considerably large, thus occupying a wide area, which inevitably makes the air conditioner large. This large size problem becomes serious in the air conditioners for smaller rooms.

In addition, the conventional drive control apparatus includes the photocoupler 35 as described above. The PWM frequency of the inverter of this drive control apparatus is now about 2 to 5 kHz. Under the use of this photocoupler 35, the power transistors of the inverter can be turned on even if the switching speed is relatively slow. However, when the PWM frequency of the inverter increases to tens of thousands of Hz as in the one-chip three-phase inverter using the dielectric separation, an expensive photocoupler capable of high speed switching becomes necessary.

The photocouplers which are used for the respective power transistors of the inverter are irregular in their switching speed, and thus the motor cannot be driven smoothly enough. Therefore, the dead time, for instance, must be increased.

Furthermore, the maximum output current of the above-mentioned one-chip three-phase inverter is about 1 ampere (A) at present, and thus the output capacity of the motor as the load is about 50 watts (W), maximum. Therefore, this inverter cannot drive such a motor as is required to produce output of over 1500 W in the compressor of the air conditioner for a room.

SUMMARY OF THE INVENTION

It is an object of the invention to provide a drive control apparatus which can drive a high-speed inverter and can be used to control a high-power motor for driving the compressor of a small-sized and inexpensive air conditioner.

According to this invention, there is provided a drive control apparatus for controlling the motor which drives the compressor of such an air conditioner. The drive control apparatus comprises a rectifying circuit for converting an AC voltage into a DC voltage; and inverter which includes a combination of a plurality of power semiconductor devices and controls the DC voltage from the rectifying circuit in response to a drive signal supplied to the combination of semiconductor devices so as to generate an AC drive current that is to be supplied to the motor; and a control circuit for generating the drive signal to the inverter, the control circuit and the rectifying circuit being all or partially formed by a monolithic integrated circuit having the dielectric separation structure, the monolithic integrated circuit and the inverter being mounted on a common board in the form of a module.

Since the base drive circuit is integrated in a monolithic form by the dielectric separation technique, the base drive circuit can be small and has a high breakdown voltage, and therefore the photocoupler used so far in conventional systems is not necessary.

In addition, since the monolithic integrated circuit and the power semiconductor devices of the inverter are formed in a module, the space which these monolithic integrated circuit and the power semiconductor devices occupy is small and thus the drive control apparatus itself can be small, as well.

BRIEF DESCRIPTION OF THE DRAWINGS

FIG. 5A is a cross-sectional diagram of the dielectric separation structure which can be employed in this invention;

FIG. 5B is a diagram showing the arrangement of the circuits of the monolithic integrated circuit which can be employed in the invention;

DESCRIPTION OF THE PREFERRED EMBODIMENTS

An embodiment of the invention will be described with reference to the accompanying drawings.

Figure 3:
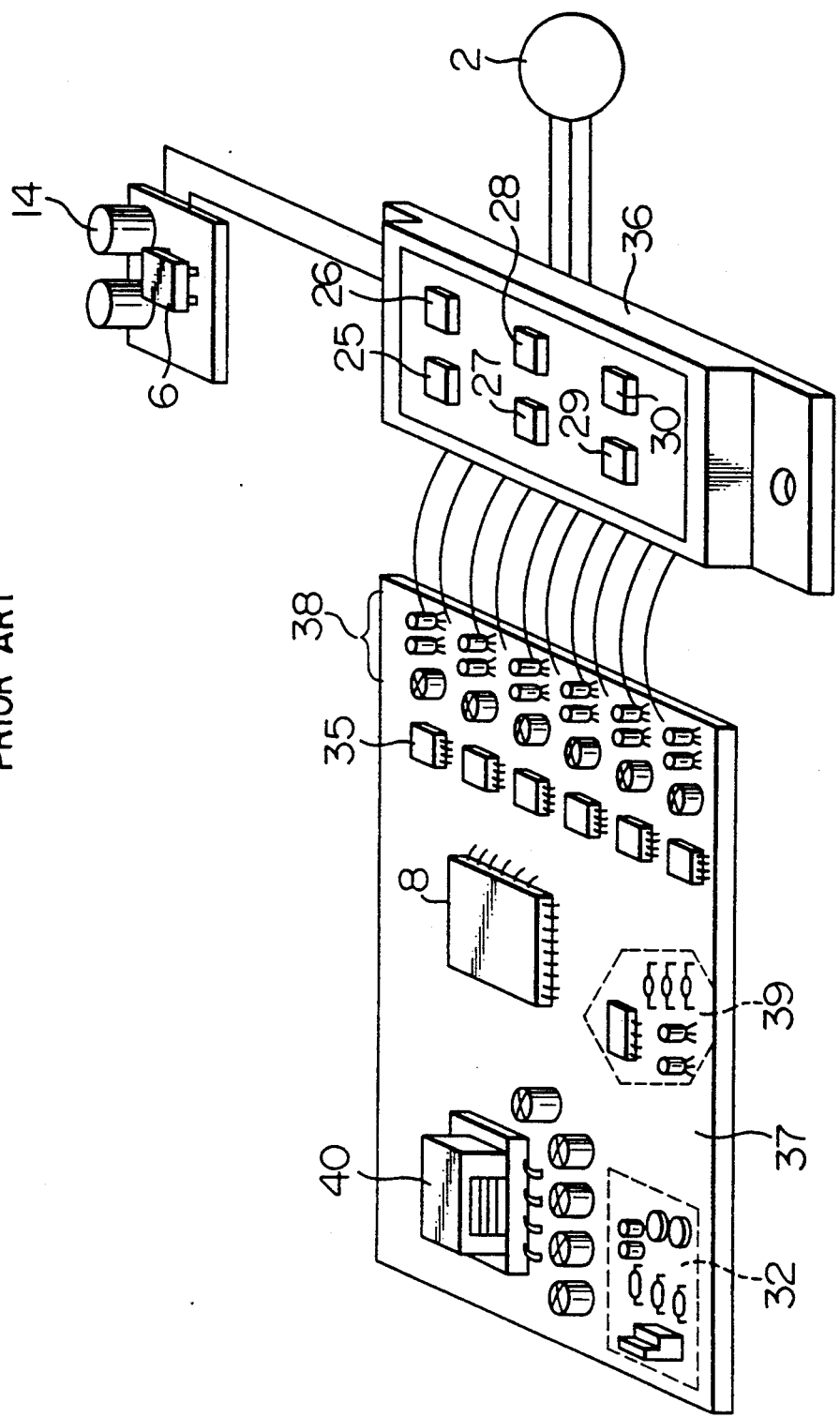
FIG. 3 is a diagram of the arrangement of the components of the drive control apparatus.
Figure 6:
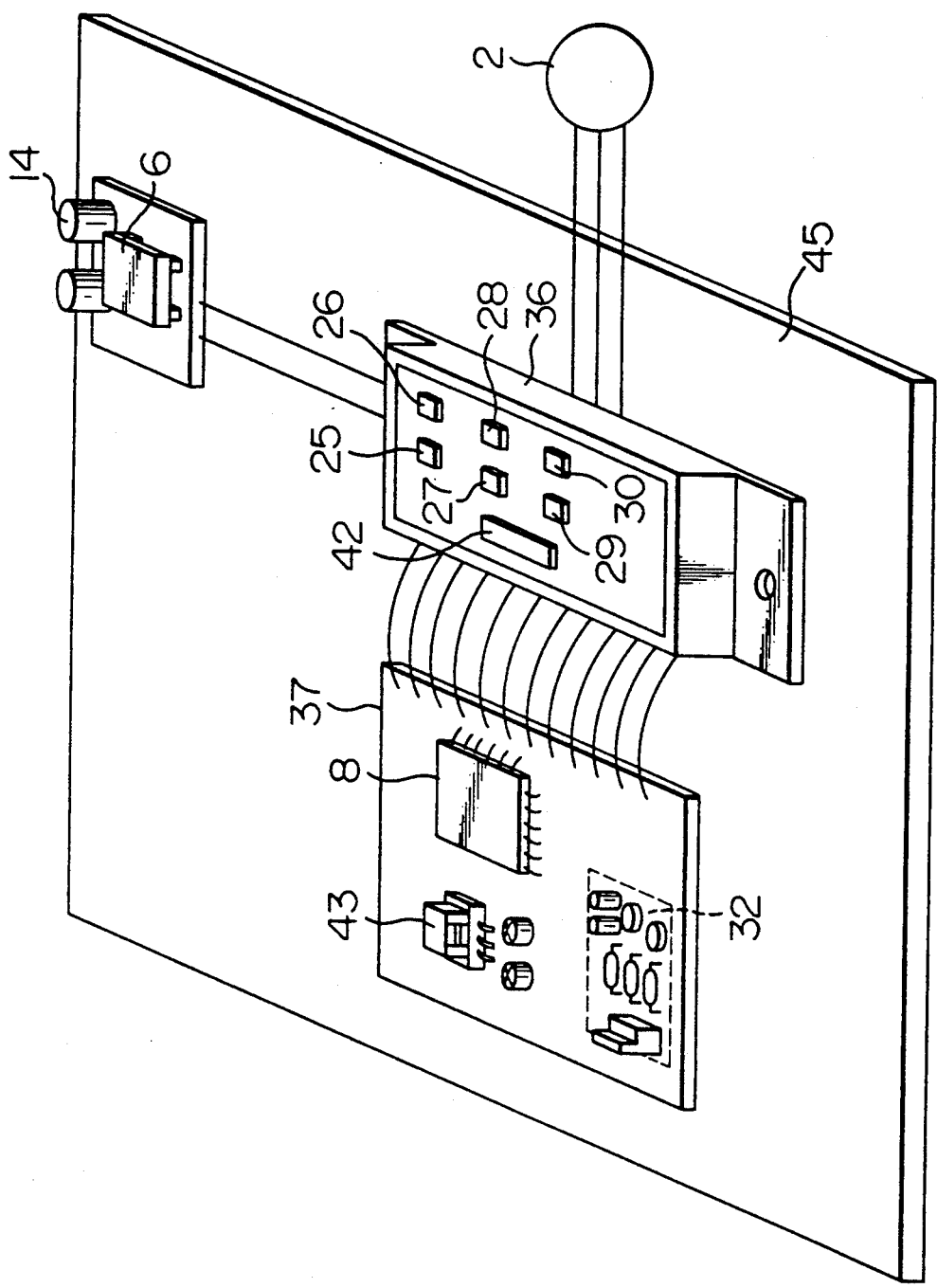
FIG. 6 is a perspective view of the arrangement of the components of the drive control apparatus according to this invention.

FIG. 6 is a construction diagram of one embodiment of the drive control apparatus of the invention. Referring to FIG. 6, there are shown a one-chip monolithic integrated circuit 42 and an internal DC power supply 43. In FIG. 6, like elements corresponding to those in FIG. 3 are identified by the same reference numerals.

Figure 1:
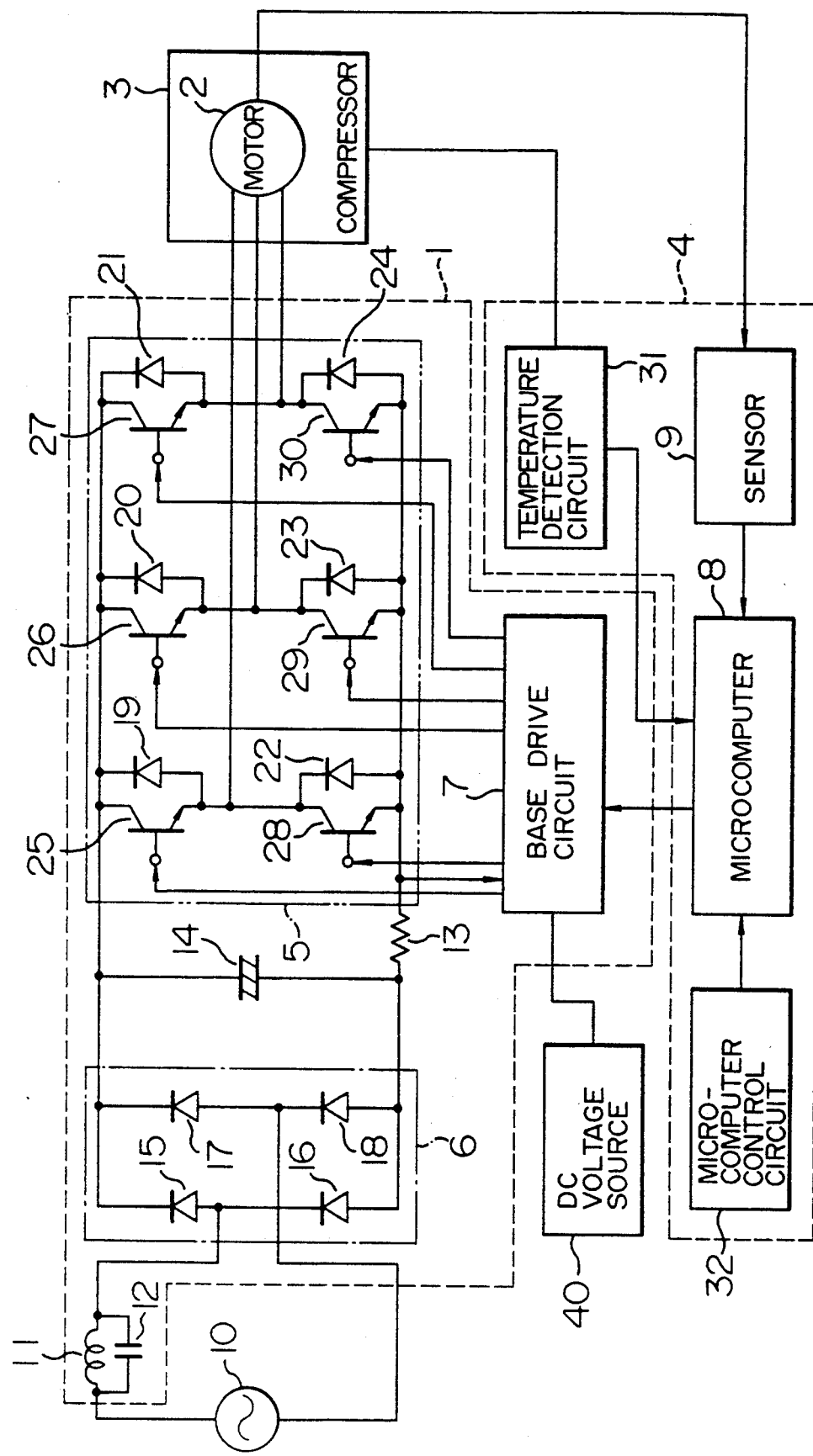
FIG. 1 is a block diagram of the drive control apparatus for controlling the compressor of the air conditioner.
Figure 4:
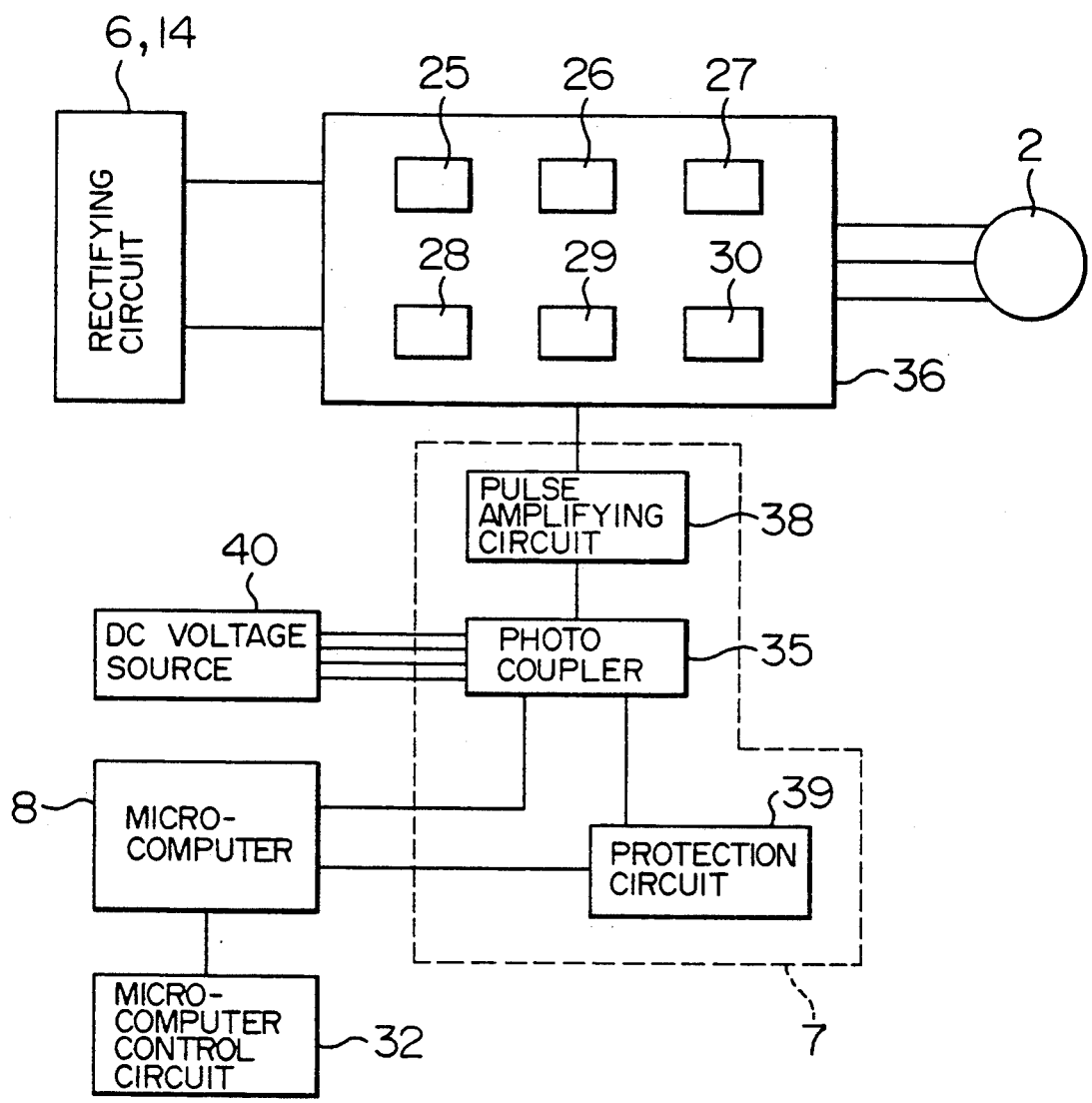
FIG. 4 is a block diagram of the circuit arrangement of the drive control apparatus.

The circuit arrangement of this embodiment is the same as shown in FIG. 1. In FIG. 6, the monolithic integrated circuit 42 has incorporated therein the three-phase base drive circuit 7 which has the function for protecting the power semiconductor devices connected as in FIG. 1 from overcurrent and temperature (or which has the overcurrent protection circuit 39 shown in FIG. 4), and a DC drive voltage generation circuit 44 for the upper arm (or the power transistors 25 to 27) of the inverter 5. This monolithic integrated circuit 42 and the power transistors 25 to 30 as chip components are mounted on the same module 36. The DC voltage source 43 generates a DC drive voltage common to the lower arm (the power transistors 28 to 30) of the inverter 5. The DC voltage generation circuit 44 for supplying DC voltages to the base drive circuit 7 within the monolithic integrated circuit 42 generates the DC voltages on the basis of the DC voltage from the DC voltage source 43 and supplies the DC voltages through the base drive circuit 7 to the power transistors 25, 26, and 27.

In the drive control apparatus shown in FIG. 1, the rectifying circuit 6, the inverter 5, the current detecting resistor 13 and the base drive circuit 7 can be formed as a module. The power-factor improving reactor 11 and capacitor 12 and the smoothing capacitor 14, which are large-capacity high-energy elements, are difficult to be formed as a monolithic integrated circuit. In addition, the signal controller 4 including the microcomputer 8 generally can be formed as a monolithic integrated circuit if the capacity is small.

In this embodiment, the base drive circuit 7 is formed as a monolithic integrated circuit including the overcurrent protecting circuit 39 for protecting the power transistors 25 to 30 from overcurrent and temperature and the DC voltage generation circuit 44 for generating DC voltages to the power transistors 25, 26 and 27 of the upper arm of the inverter 5. Of course, portions other than the base drive circuit 7 the DC drive voltage generation circuit 44 for the upper arm of the inverter 5 may also be formed as a monolithic integrated circuit. However, for a large power motor (for example, exceeding 3-A current in the inverter 5) such as the motor 2 for the compressor of an air conditioner, a considerably large chip area is required for the integrated circuit, and thus does not meet the desired cost-performance. This will result in a difficulty in the production.

Figure 7:
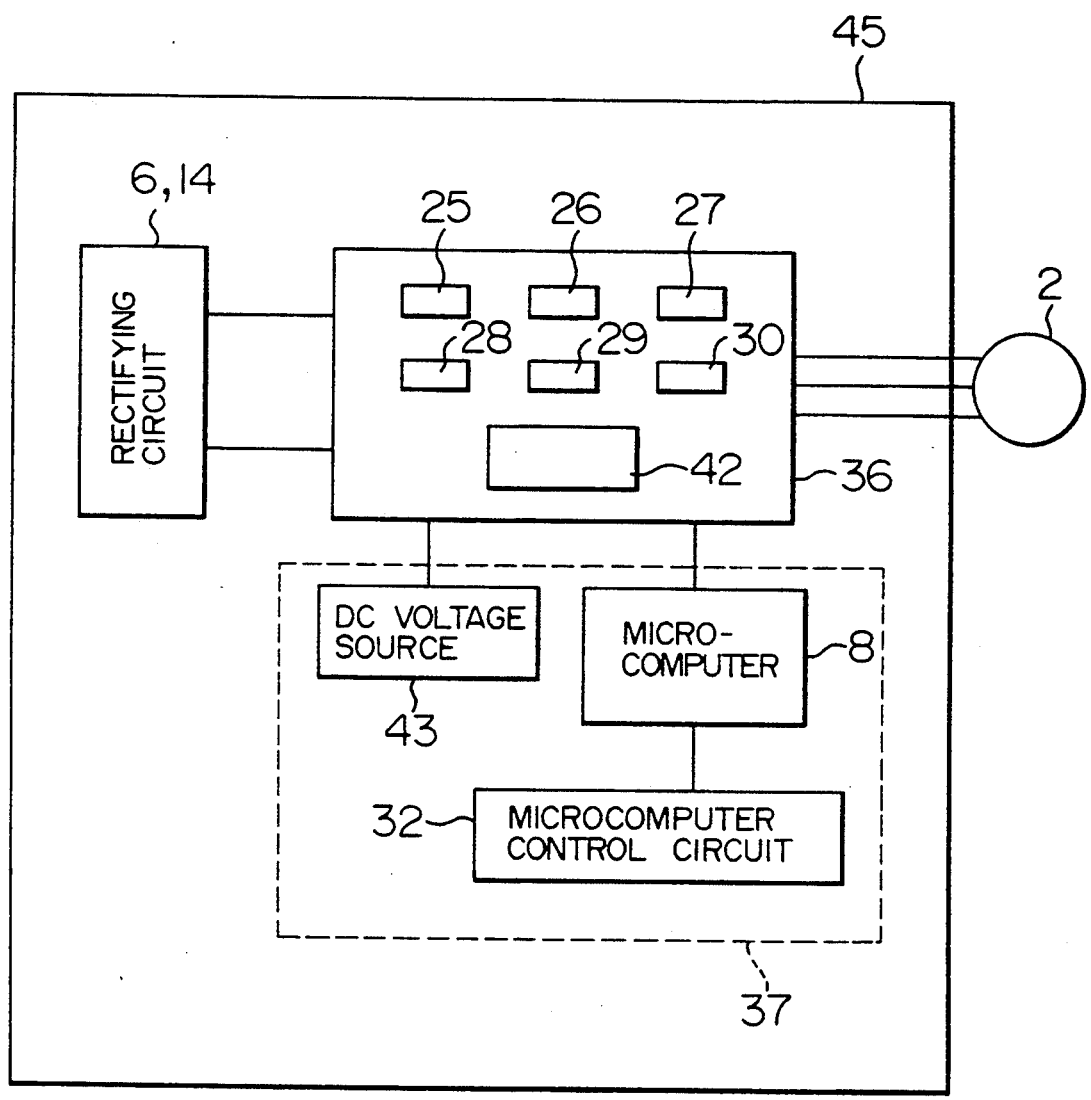
FIG. 7 is a block diagram of the circuit arrangement of the drive control apparatus according to this invention.

FIG. 7 is a block diagram of the present embodiment of the invention. The output pulse signal from the microcomputer 8 is supplied to the monolithic integrated circuit 42. This monolithic integrated circuit 42 responds to this pulse signal to control the DC drive voltage from the DC voltage source 43 to be supplied to the power transistors 28 to 30 and to generate different DC drive voltages to the power transistors 25, 26 and 27 on the basis of this DC drive voltage.

Figure 2:
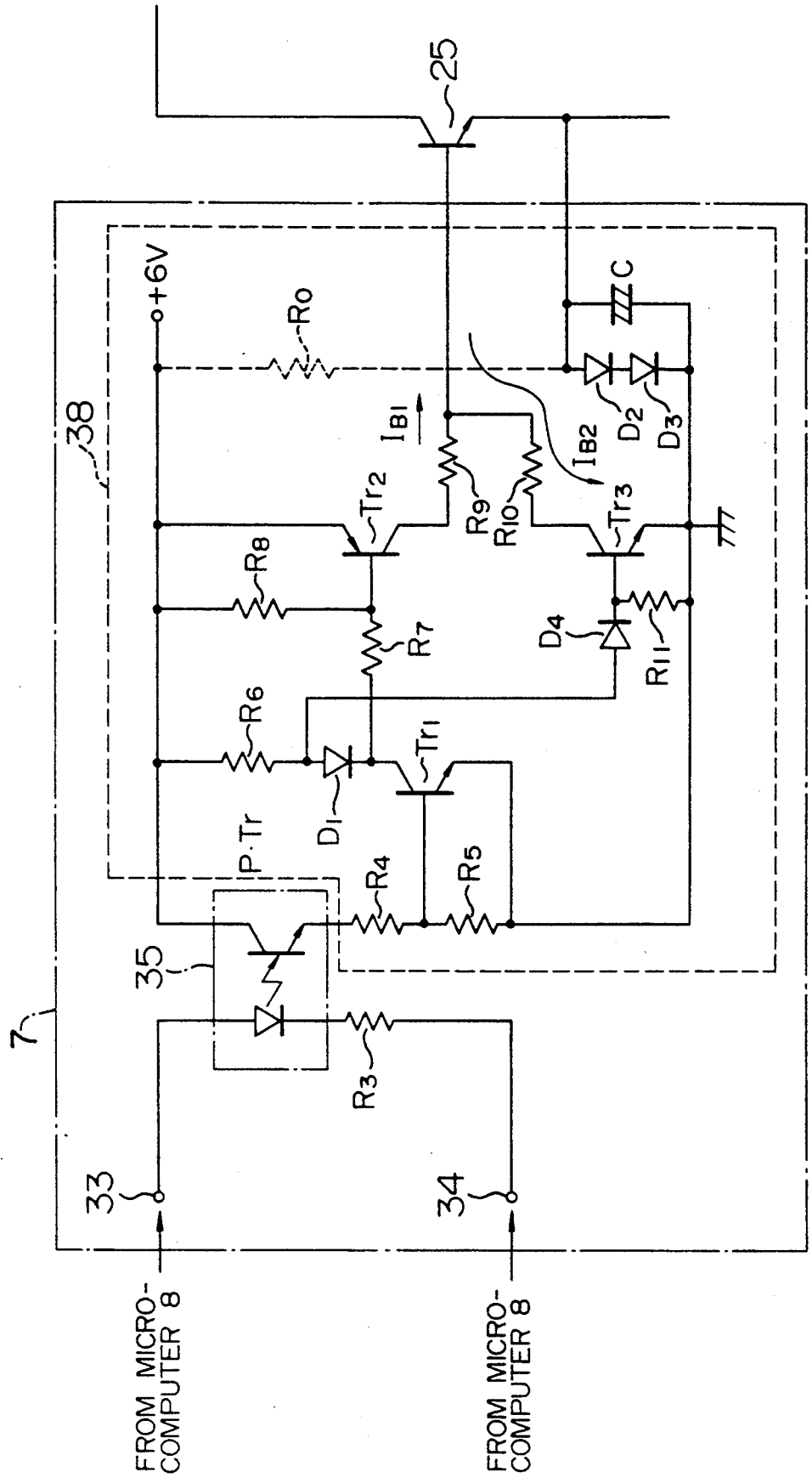
FIG. 2 is a circuit diagram of a specific example of the general base drive circuit.
Figure 8:
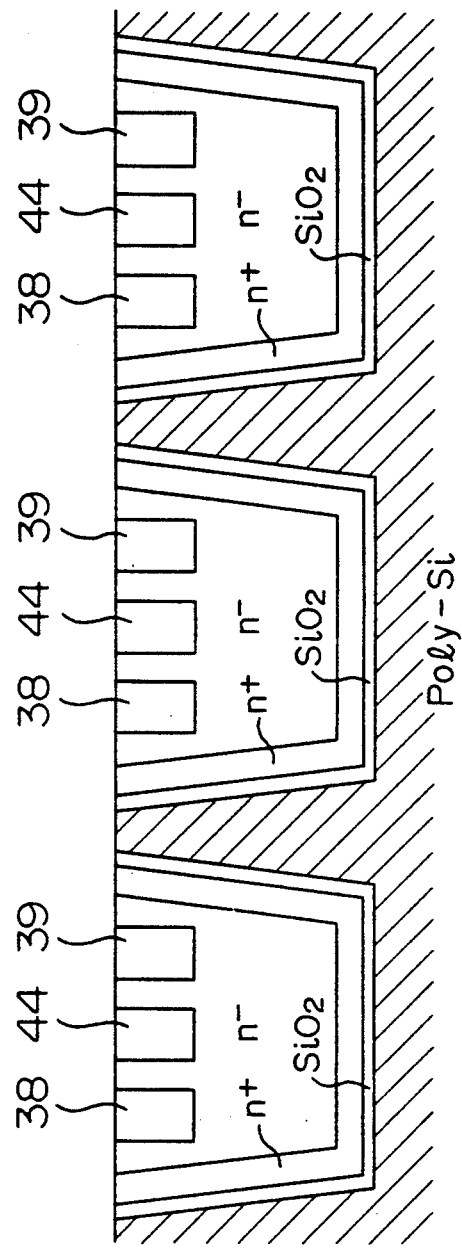
FIG. 8 is a cross-sectional diagram of the dielectric separation structure according to this invention.

FIG. 8 is a cross-sectional diagram of the dielectric separation substrate of the monolithic integrated circuit 42 in FIG. 6. In FIG. 8, the respective phase portions are formed in different areas, and there are shown the overcurrent protecting circuit 39 and the pulse amplifying circuit 38 of the base drive circuit 7 shown in FIGS. 3 and 4, and the DC voltage generation circuit 44 for generating three different DC drive voltages to the upper arm of the inverter 5. This dielectric separation technique, or structure serves as the photocoupler. Thus, photocoupler 35 as shown in FIG. 2 can be omitted.

The comparison between this embodiment and the previously mentioned prior art will be described with reference to FIGS. 6 and 3. In the embodiment shown in FIG. 6, the photocoupler 35, pulse amplifying circuit 38 and overcurrent protecting circuit 39 shown in the prior art of FIG. 3 are formed as one-chip monolithic integrated circuit. In addition, since the internal DC power supply 43 may generate only the DC drive voltage to the lower arm of the inverter 5, it can be greatly reduced in its size as compared with the internal DC power supply 40 shown in FIG. 3, and thus the circuit board 37 can be considerably reduced as well. Therefore, the drive control apparatus can be greatly reduced in size.

Although the monolithic integrated circuit 42 may be provided on the circuit board 7, this monolithic integrated circuit 42 and the inverter 5 are formed as a module as shown in FIG. 6 because the drive control apparatus can be further reduced in size.

Figure 9:
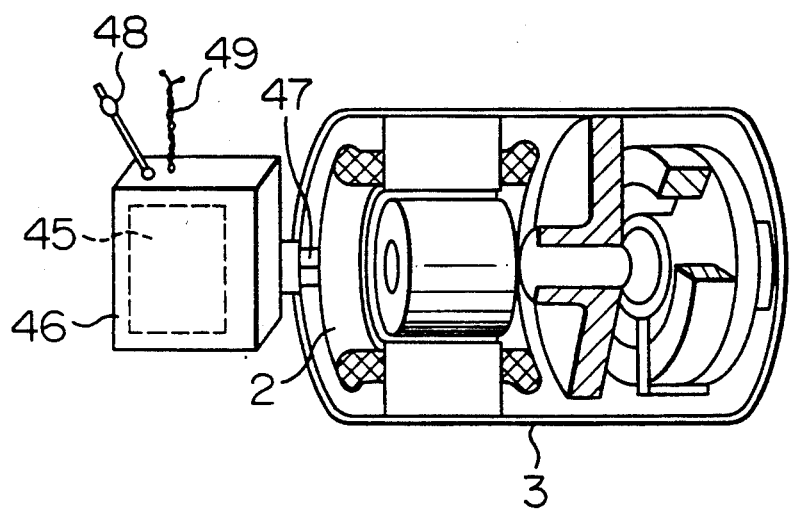
FIG. 9 is a diagram of the compressor body and a metal case which includes the drive control apparatus and is fixed to the compressor.
Figure 10:
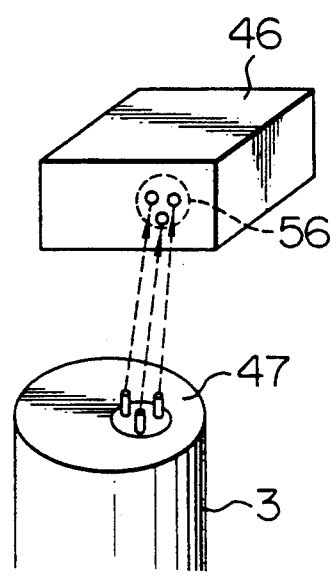
FIG. 10 is a detailed diagram of the connection between the metal case and the compressor.

The drive control apparatus, 45 mentioned above can be placed within a metal case 46 and connected to the motor 2 of the compressor 3 through hermetically sealed terminal pins 47 as shown in FIG. 9. FIG. 10 is an enlarged view of this connection means. In general, since the windings of the motor 2 within the compressor 3 are electrically connected to the power transistors 25 to 30 of the inverter 5 as shown in FIG. 1, the hermetically sealed terminal pins 47 are provided on the end of the compressor 2. On the metal case 46 there is provided a receptacle terminal 56 which the airtight terminal pins 47 are plugged into so that the power transistors 25 to 30 of the inverter 5 can be directly connected to the windings of the motor.

A power cord 48 to be connected to the commercial power supply 10 (FIG. 1) and signal lines 49 to be connected to the microcomputer 8 (FIG. 1) are drawn out of the metal case 46 as the external connection lines. A speed command for controlling the motor 2 for the compressor to be changed in its revolution rate in accordance with the change of the external temperature, and a start command for starting the motor 2 of the compressor are supplied through the signal lines 49 to the drive control apparatus 45.

The power transistors 25 to 30 of the inverter 5 may be devices of BJT (Bipolar Junction Transistor), MOS FET (Metal Oxide Semiconductor Field-Effect transistor), IGBT (Insulated Gate Bipolar Transistor) or the like.

In addition, while in the prior art the detection element such as a thermistor for preventing the temperature of the compressor 3 from increasing excessively is mounted on the compressor 3 so as to detect the temperature, the metal case 46 with good thermal conductivity is in direct contact with the compressor 3 as shown in FIG. 9 so that the temperature of the metal case is equal to that of the compressor 3. Therefore, since the temperature detector 31 of the compressor 3 in FIG. 1 is mounted within the metal case with good thermal conductivity, the temperature of the compressor 2 can be detected by the temperature detector 31 within the metal case 46 without drawing the thermistor leads out of the compressor 3. Also, since the thermistor is shielded by the metal case 46, the thermistor can be protected from radiated noise. When the temperature of the compressor 3 is increased to some extent, a fan motor, for instance, may be driven to cool the compressor 3 and the metal case 46.

While the dielectric separation structure in this embodiment employs oxide films ($SiO_2$), this invention is not limited to this embodiment, but may use other dielectric substances or insulating materials for the separation.

According to this invention, as described above, since the base drive circuit including the function to protect the power devices from overcurrent and excessive temperatures is formed as a monolithic integrated circuit and since the power supply to the power devices is incorporated in the same monolithic integrated circuit, only one external power supply is necessary for driving the power devices, and this monolithic integrated circuit and the power devices are mounted within one module. Therefore, the number of components to be mounted on the circuit board can be decreased and thus the circuit board occupies a small area with the result that the drive control apparatus can be greatly reduced in its size.

Moreover, since the number of components to be mounted on the circuit board can be decreased, the number of solder junctions on the circuit board can be reduced, so that the reliability of the circuits mounted on the circuit board can be increased.

In addition, even though the carrier frequency of the inverter is higher than the audio frequencies, the expensive photocoupler necessary in the prior art is not necessary in this invention, thus leading to low cost.

Furthermore, since the base drive circuit is constructed on one chip, the switching speeds in the respective phases are substantially equal and thus the dead time can be designed to be as very short as 1.5 $\mu s$, as compared with 3 $\mu s$ in use of the conventional photocoupler.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A drive control apparatus for controlling a motor which drives a compressor of an air conditioner, comprising:

a rectifying circuit for converting an AC voltage into a DC voltage;

an inverter, having a combination of a plurality of power controlling semiconductor devices, for controlling said DC voltage from said rectifying circuit in accordance with a drive signal supplied to said combination of said semiconductor devices so as to produce an AC drive current to said motor; and a drive circuit for generating said drive signal to said inverter, said drive circuit being formed as a monolithic integrated circuit surrounded by a dielectric separation structure, and said monolithic integrated circuit, said inverter and said rectifying circuit being mounted on a common substrate of a module.

2. A drive control apparatus according to claim 1, further comprising a microcomputer for generating a control signal and a protective circuit for protecting said semiconductor devices from overcurrent and/or overheating, said drive circuit generating said drive signal in accordance with said control signal from said microcomputer.

3. A drive control apparatus according to claim 2, wherein said protective circuit is formed in said monolithic integrated circuit, and said microcomputer is mounted on said common substrate.

4. A drive control apparatus according to claim 1, further comprising a DC voltage source, wherein said inverter is formed of a three-phase bridge type inverter circuit having a combination of power control switching devices, and said drive circuit controls a DC voltage from said DC voltage source in accordance with said control signal so as to generate said drive signal for turning on and off said power control switching devices of said three-phase bridge type inverter circuit.

5. A drive control apparatus according to claim 4, wherein said DC voltage source is provided separately from said module.

6. A drive control apparatus according to claim 5, wherein circuits separate from said module are mounted on a common circuit board.

7. A drive control apparatus according to claim 6, wherein said module and said common circuit board are mounted in a metal case, and said metal case and a container including said compressor are coupled with each other for good thermal conduction.

* * * * *